(12) United States Patent
Tanaka

(10) Patent No.: US 6,307,312 B1
(45) Date of Patent: Oct. 23, 2001

(54) IMMERSION LENS AND ELECTRON BEAM PROJECTION SYSTEM USING THE SAME

(75) Inventor: Hitoshi Tanaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/266,090

(22) Filed: Mar. 10, 1999

(30) Foreign Application Priority Data

Mar. 31, 1998 (JP) .................................................. 10-086887

(51) Int. Cl.[7] .............................. H01J 29/50; H01J 3/14; H01J 3/26; H01J 49/42; G21K 1/08
(52) U.S. Cl. .................. 313/412; 313/440; 250/396 ML; 250/311
(58) Field of Search ...................................... 313/412, 413, 313/428, 426, 427, 431, 433, 440, 442, 346 R; 250/310, 311, 398, 396 ML, 492.2

(56) References Cited

U.S. PATENT DOCUMENTS

| 4,544,846 | 10/1985 | Langner et al. ...................... 250/396 |
| 5,981,947 | * 11/1999 | Nakasuji et al. ...................... 250/310 |
| 6,057,553 | * 5/2000 | Khurseed et al. .............. 250/442.11 |
| 6,069,684 | * 5/2000 | Golladay et al. ....................... 355/53 |

* cited by examiner

Primary Examiner—Nimeshkumar D. Patel
Assistant Examiner—Karabi Guharay
(74) Attorney, Agent, or Firm—Christie, Parker & Hale, LLP

(57) ABSTRACT

An immersion lens comprising a first magnetic lens unit for generating a first magnetic field and a second magnetic lens unit for generating a second magnetic field is disclosed. The combined magnetic field of the first and second magnetic fields converges the electron beam between the first magnetic lens unit and the second magnetic lens unit. The immersion lens is reduced in size by configuring the second magnetic lens of a permanent magnet.

6 Claims, 4 Drawing Sheets

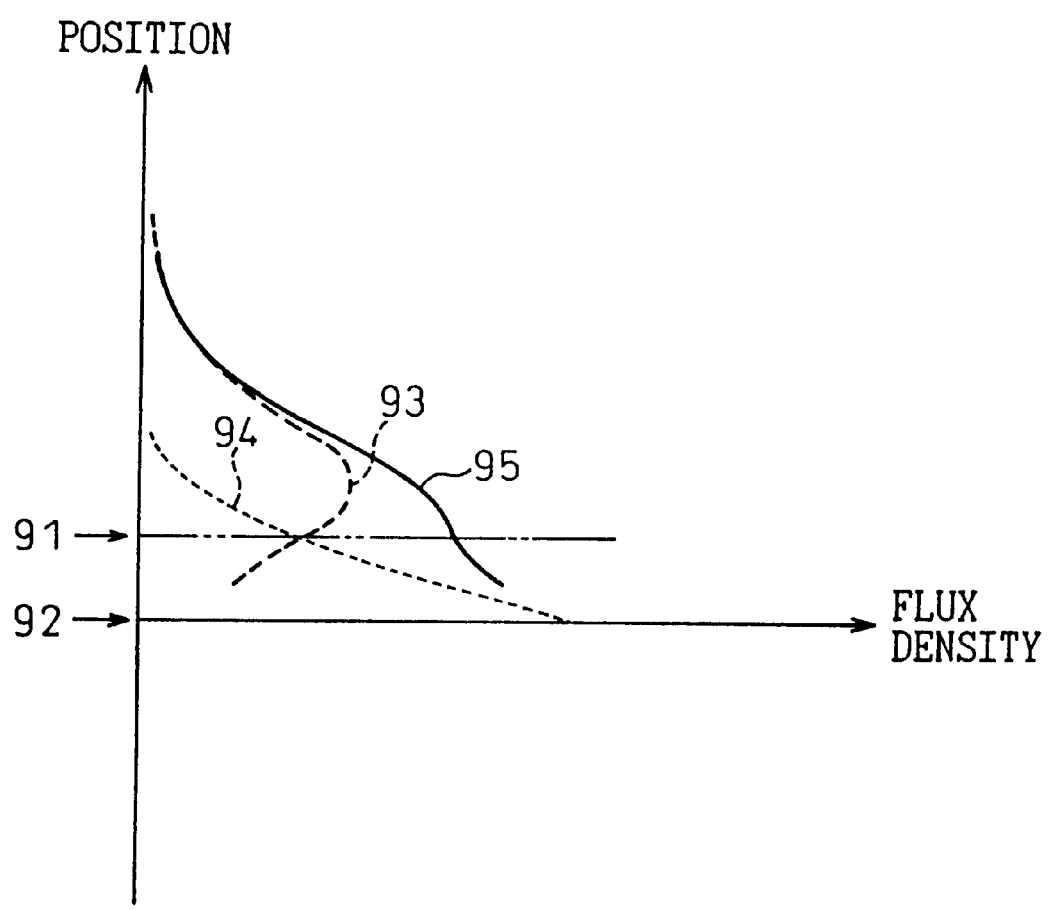

IMMERSION LENS AND ELECTRON BEAM PROJECTION SYSTEM USING THE SAME

BACKGROUND OF THE INVENTION

The present invention relates to an electron beam projection system, such as an electron beam exposure apparatus or an electron microscope, for converging and projecting an electron beam and to magnetic lenses used for the devices or, in particular, to an immersion lens with two magnetic lenses arranged at the sides of a specimen surface on which the electron beam is converged.

The electron microscope currently finds wide applications as a means for observing very small objects. Electron microscopes are of two types, a transmission type and a scanning type. In the transmission electron microscope, in which the electron beam is applied from one side of a specimen and the image of the electron beam transmitted through the specimen is detected, the resolution is determined by the image-forming performance of the magnetic lens functioning as an objective lens. On the other hand, the scanning electron microscope, in which a specimen is scanned by an electron beam converged to a very small spot and the electrons transmitted through or reflected from the specimen are detected, is such that the resolution is determined by the size of the spot of the electron beam which in turn is determined by the image-forming performance of the magnetic lens functioning as a convergent lens.

In recent years, an electron beam exposure apparatus high in resolution and capable of forming a pattern smaller than photolithography has been closely watched as a lithography apparatus for exposing a small pattern for a semiconductor device, etc. An electron beam exposure apparatus can be one of several types. In one type, as in the scanning electron microscope, a pattern is exposed on a resist coated on a substrate by the electron beam converged onto a very small spot. In another type, the electron beam is formed into the desired pattern through a mask on a specimen. In both types, the resolution is determined by the image forming performance of the magnetic lens functioning as a convergent lens. As described above, the resolution of the electron microscope and the electron beam exposure apparatus is determined by the magnetic lens functioning as a convergent lens or an objective lens, and the image forming performance of the magnetic lens must be superior to obtain a high resolution.

The magnetic lens includes a coil, a yoke and pole pieces. The magnetic field created by the coil and the yoke is deformed into the desired shape by the pole pieces. Two or more magnetic lenses can be combined to form a magnetic lens of the desired performance. Generally, in the transmission electron microscope, pole pieces are arranged on the sides of a specimen, and the desired magnetic field is formed above and under the specimen as a magnetic lens. A magnetic lens with such means as pole pieces arranged on both sides of the surface of the specimen (target) for controlling the magnetic field is called the immersion lens. By using the immersion lens, a high resolution is obtained as the desired magnetic field is formed also on the specimen.

In the scanning electron microscope and the electron beam exposure apparatus, in contrast, it is general practice to arrange a magnetic lens only on one side of a specimen, so that the desired magnetic field cannot be easily formed on the specimen surface and a sufficient image-forming performance cannot be obtained. A method conceivable for improving this situation is to employ an immersion type having a superior characteristic in terms of aberration by forming a magnetic field also on the specimen surface. In such a case, the stage for supporting the image cannot be made of a metal but must be made of ceramics.

U.S. Pat. No. 4,544,846 discloses an electron beam projection system comprising an immersion lens having an upper pole piece with a non-zero bore and a lower pole piece including a section with a zero bore.

As described above, the immersion lens used for the transmission electron microscope comprises, in addition to a coil and a yoke, two pole pieces arranged on both sides of the specimen. It is also possible to form an immersion lens by combining two or more magnetic lenses. In this specification, the magnetic field forming means arranged on the incidence side of the electron beam with respect to the specimen is called the first magnetic lens, and the magnetic field forming means arranged on the opposite side the second magnetic lens. The first and the second magnetic lenses of the immersion lens used for the transmission electron microscope are electromagnetic lenses configured of a coil, a yoke and pole pieces. This also applies to the first and second magnetic lenses of the immersion lens disclosed in U.S. Pat. No. 4,544,846, which are electromagnetic lenses.

In the electron beam exposure apparatus, for example, the second magnetic lens is required to generate a strong upward magnetic field of about 0.1 tesla (100 Gausses). The electromagnetic lens capable of generating such a strong magnetic field unavoidably increases in size. The second magnetic lens is arranged under the stage. A large second magnetic lens arranged in such a position reduces the freedom of design of the stage, thereby making it impossible to obtain the desired stage performance.

Another problem is that the electromagnetic lens has the coils thereof supplied with a current. For a large magnetic flux density to be generated, therefore, a large current is supplied which increases the heat generation. The resulting heat distribution occurring in the surrounding area distorts the stage, thereby leading to a lower projection accuracy.

SUMMARY OF THE INVENTION

The object of the present invention for solving these problems is to realize an immersion lens comprising a compact second magnetic lens.

In order to achieve the object described above, according to one aspect of the invention, there is provided an immersion lens including a second magnetic lens having a permanent magnet.

According to another aspect of the invention, there is provided an immersion lens in which an auxiliary coil and a yoke are arranged around the permanent magnet of the second magnetic lens so that the magnetic field generated by the second magnetic lens can be finely adjusted.

According to the invention, the second magnetic lens includes a permanent magnet, and therefore is smaller in size than when it is formed only of an electromagnetic lens having a coil and a yoke.

With an immersion lens used for the electron beam exposure apparatus or the scanning electron microscope, the permanent magnet of the second magnetic lens is preferably solid-cylindrical in shape. This is by reason of the fact that a solid cylinder, as compared with a hollow cylinder, can generate large magnetic fluxes in axial direction. In such an apparatus, the second magnetic lens can be arranged behind the specimen and can be solid-cylindrical in shape since no electron beam passes through.

BRIEF DESCRIPTION OF THE DRAWINGS

The present invention will be more clearly understood from the description as set below with reference to the accompanying drawings, wherein:

FIG. 5 is a diagram showing the distribution of magnetic fluxes of an immersion lens of an electron beam exposure apparatus according to an embodiment.

DESCRIPTION OF THE PREFERRED EMBODIMENTS

Before proceeding to the detailed description of the preferred embodiment, a prior art immersion lens will be described with reference to the accompanying drawings for a clearer understanding of the differences between the prior art and the present invention.

Figure 1:
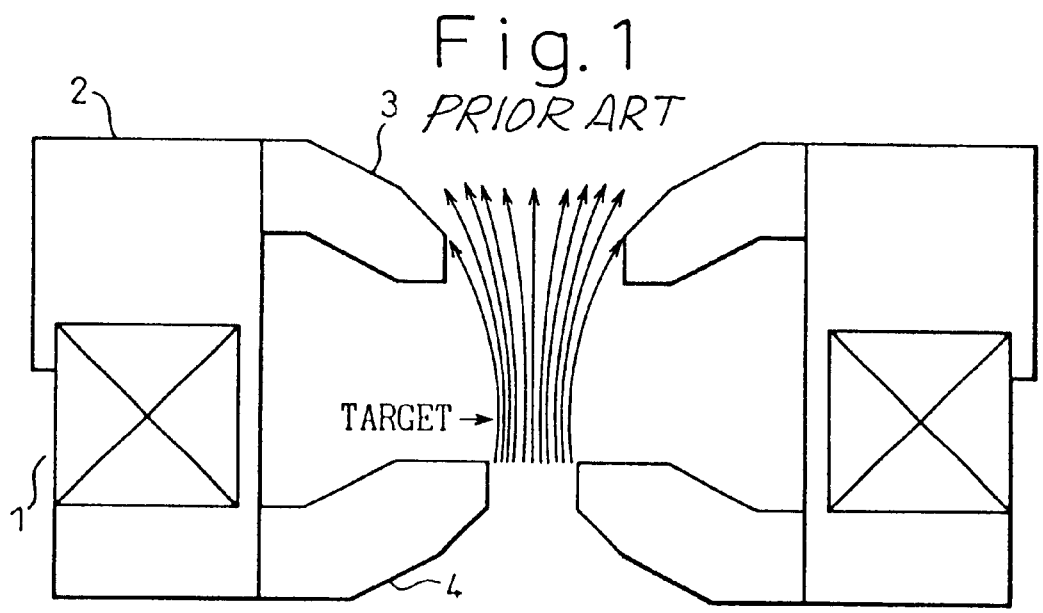
FIG. 1 is a diagram showing a configuration of a conventional immersion lens used for a transmission electron microscope.
Figure 2:
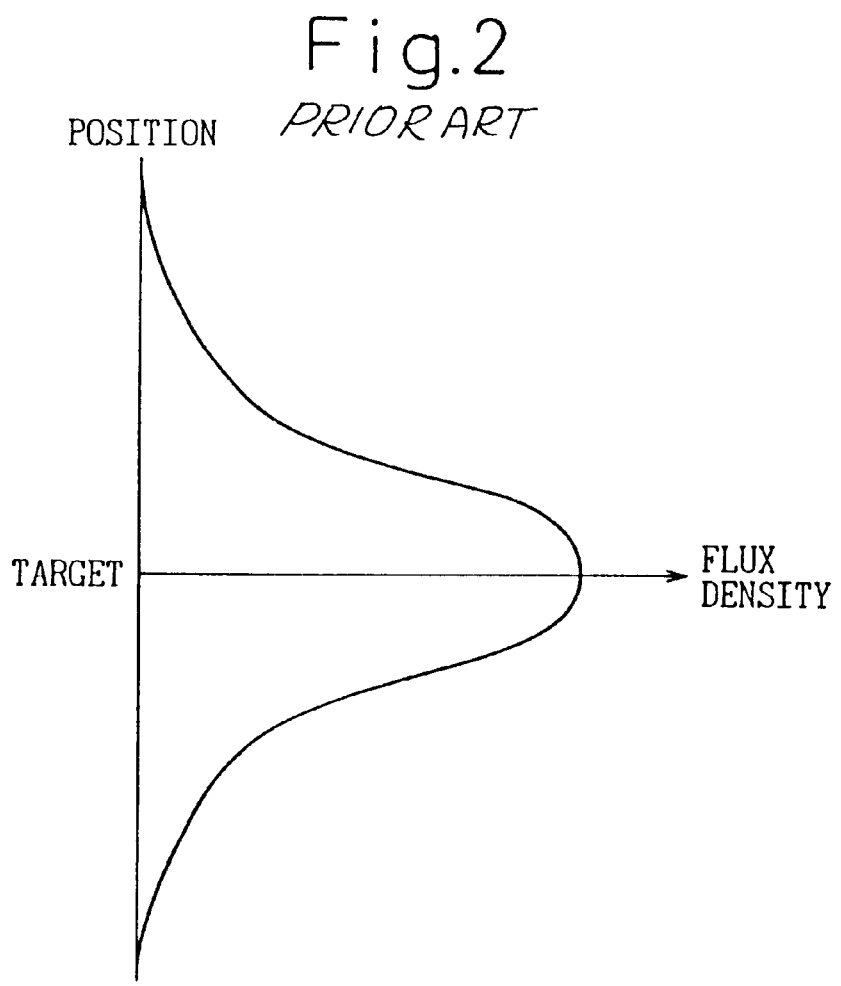
FIG. 2 is a diagram showing an example distribution of the magnetic flux density of the immersion lens shown in FIG. 1 in the neighborhood of the specimen surface.

FIG. 1 is a diagram showing an example configuration of an immersion lens used as an objective lens of a conventional transmission electron microscope. FIG. 2 is a diagram showing the distribution of the magnetic fluxes of the magnetic field in the neighborhood of the specimen formed by the immersion lens of FIG. 1.

With the immersion lens shown in FIG. 1, a uniform magnetic field directed upward, which is generated by supplying a current to a coil 1 wound on a yoke 2, is deformed by a first pole piece 3 and a second pole piece 4 thereby to form a magnetic field as shown in the neighborhood of a target. The magnetic flux density of the magnetic field is as shown in FIG. 2, for example. The yoke 2 and the pole pieces 3, 4 are symmetric about the axis and generate a magnetic field symmetric about the axis. The electron beam entering this magnetic field is subjected to the force in the direction perpendicular to the axis due to the oblique magnetic field, and while rotating, is converged on the target surface. Since a convergent magnetic field is formed also on the target surface, the electron beam continues to be subjected to the convergent force until it reaches the target surface. Therefore, a superior image-forming performance is obtained.

In the transmission electron microscope, the electron beam entering from one direction enters the specimen arranged on the target surface and, after passing through the specimen, is projected on the observation surface through the immersion lens and the image-forming lens system. Thus, the first and second magnetic lenses making up the immersion lens are required to have a bore for transmitting the electron beam therethrough. As is clear from FIG. 1, the first and second magnetic lenses of the immersion lens used for the transmission electron microscope are electromagnetic lenses including a coil, a yoke and pole pieces.

Now, an application of the invention to the electron beam exposure apparatus will be explained. The present invention, however, is not confined to this application but is applicable to other electron beam projection systems such as a scanning electron microscope with equal effect.

Figure 3:
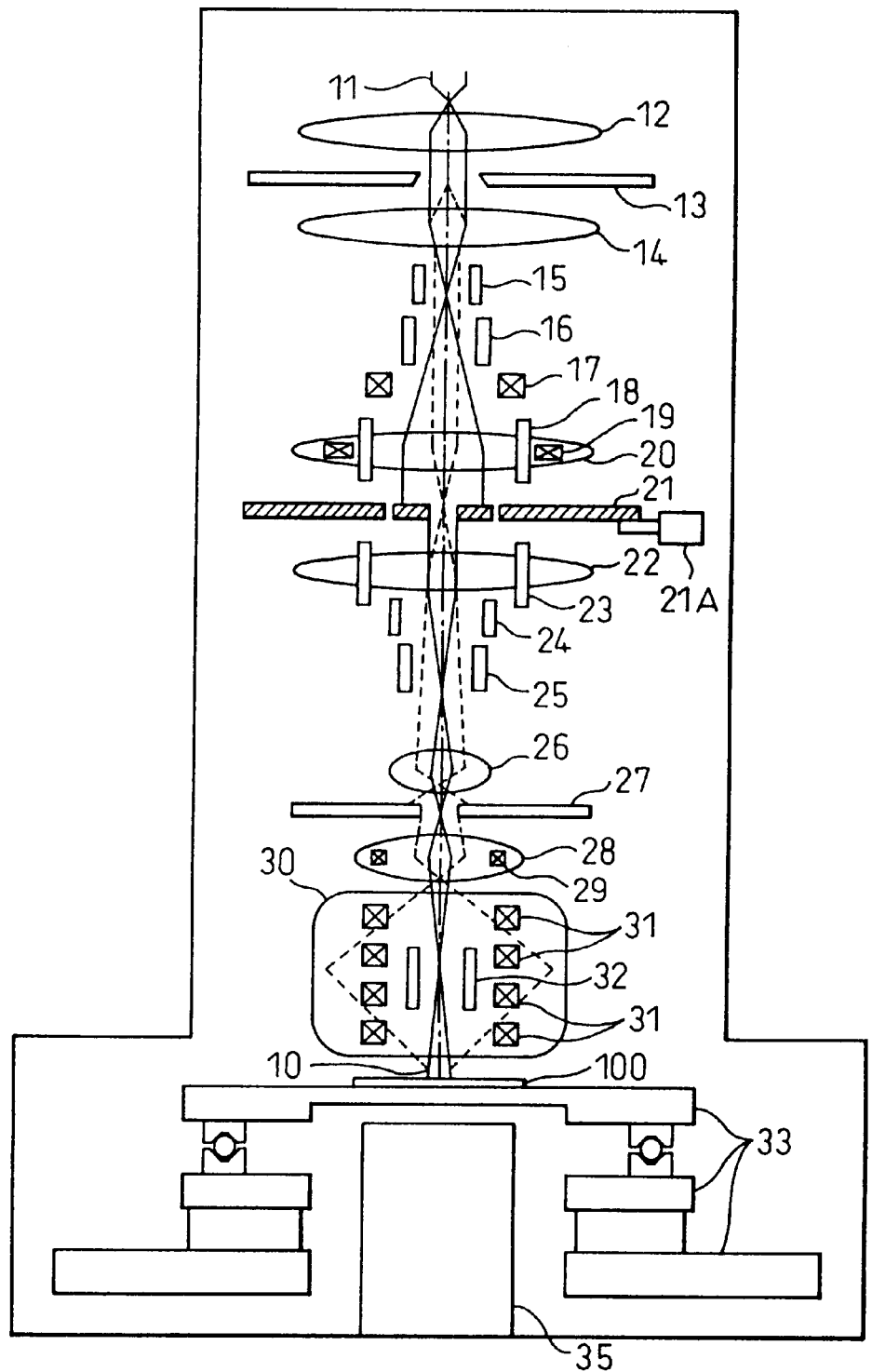
FIG. 3 is a diagram showing a general configuration of an electron beam exposure apparatus according to an embodiment of the invention.

FIG. 3 is a diagram showing a configuration of a beam projection system of an electron beam exposure apparatus of block exposure type according to an embodiment of the invention. In FIG. 3, reference numeral 11 designates an electron gun for generating an electron beam, numeral 12 a first convergent lens for converting the electron beam from the electron gun 11 into a parallel beam, numeral 13 an aperture for forming the parallel beam passing therethrough into a predetermined shape, numeral 14 a second convergent lens for reducing the beam thus formed, numeral 15 a shaping deflector, numeral 16 a mask deflector, numeral 17 a deflector for dynamically correcting the astigmatism due to a mask, numeral 18 a second mask deflector, numeral 19 a mask convergent coil, numeral 20 a first shaping lens, numeral 21 a block mask moved on a stage 21A, numeral 22 a second shaping lens, numeral 23 a third mask deflector, numeral 24 a blanking deflector for turning on/off the beam, numeral 25 a fourth mask deflector, numeral 26 a third lens, numeral 27 a circular aperture, numeral 28 a reduction lens, numeral 29 a focus coil, numeral 30 a projection lens, numeral 31 an electromagnetic main deflector, and numeral 32 an electrostatic subdeflector. These component parts are collectively called an electron-optic lens barrel (column). The electron beam 10 is converged and projected on a specimen 100 placed on a stage 33. The stage 33 is made of ceramic or the like material for moving the specimen 100 two-dimensionally within a plane perpendicular to the electron beam 10. The portion of the column through which the electron beam is passed and the coverage of the stage 33 are shut off from the surrounding by a vacuum chamber or a vacuum seal and are internally kept in a vacuum. The electron beam exposure apparatus, for exposing a desired pattern, further includes an exposure control unit for controlling the parts of the column. These component parts, however, are not related to the invention and will not be described.

As shown in FIG. 3, the electron beam exposure apparatus according to this embodiment includes a second magnetic lens under the stage 33. The projection lens 30 corresponds to the first magnetic lens.

Figure 4:
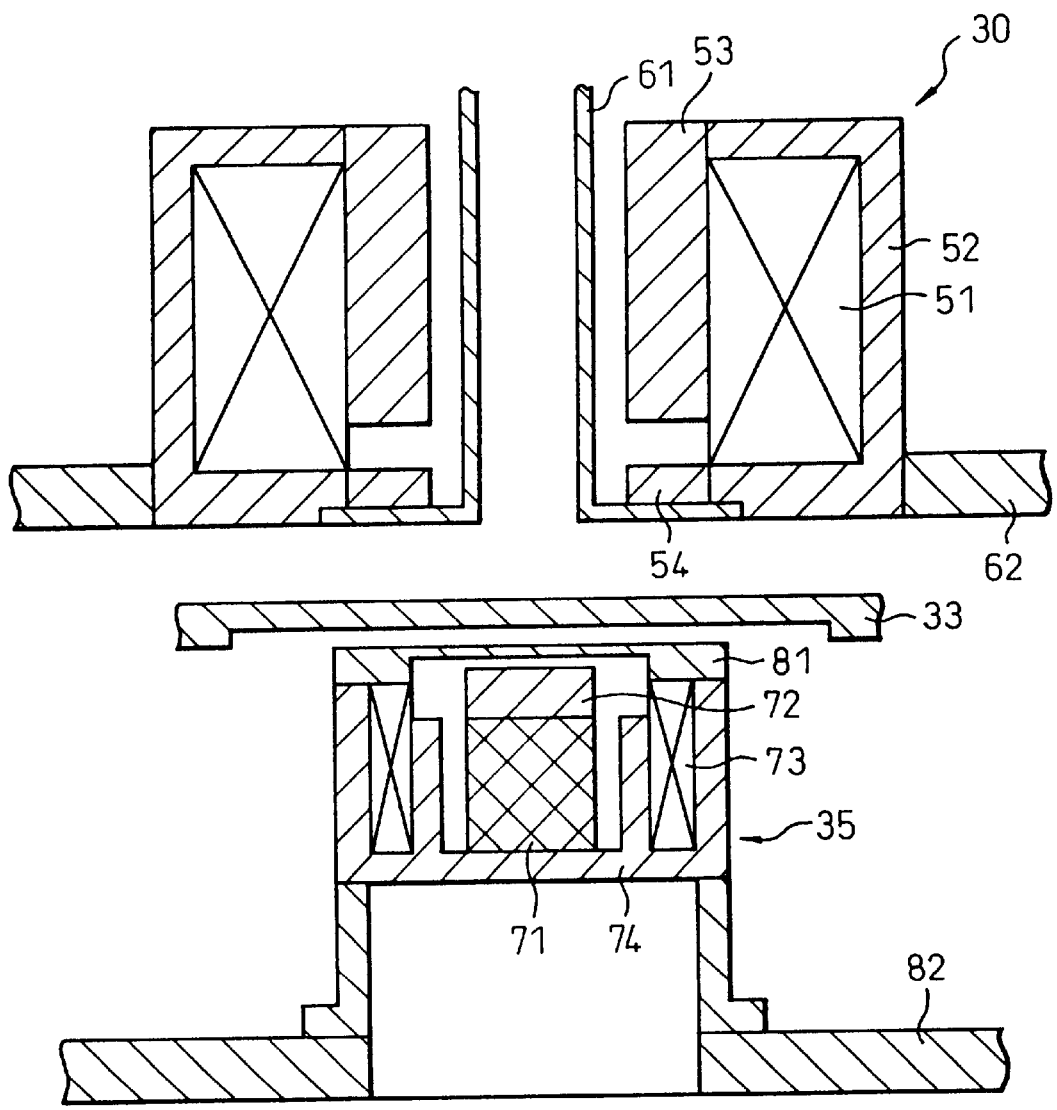
FIG. 4 is a diagram showing a configuration of an immersion lens of an electron beam exposure apparatus according to an embodiment.

FIG. 4 is a diagram showing a configuration of the portion constituting the immersion lens used for the electron beam projection system according to an embodiment of the invention. The main deflector 31 and the subdeflector 32 are not shown in this diagram. The first magnetic lens 30 is an electromagnetic lens including a coil 51, a yoke 52 and pole pieces 53, 54, and has a configuration similar to that of the conventional magnetic lens.

The second magnetic lens 35 includes a solid-cylindrical permanent magnet 71, a solid-cylindrical pole piece 72 arranged above the permanent magnet 71, an auxiliary coil 73, and a yoke 74. The permanent magnet 71 is arranged on the center axis of the yoke 74 (center axis of the system), on both sides of which an auxiliary coil 73 is arranged. Reference numeral 61 designates a vacuum seal for the column, numeral 62 the upper surface of the vacuum chamber, numeral 81 a vacuum seal for the second magnetic lens, and numeral 82 the lower surface of the vacuum chamber. The permanent magnet 71, though smaller in size than the electromagnetic lens, can generate magnetic fluxes of the same strength as the electromagnetic lens.

The magnetic fluxes generated by supplying a current to the auxiliary coil 73 form a magnetic field by being superposed on the magnetic fluxes of the permanent magnet 71. The auxiliary coil 73 is provided in addition to the permanent magnet 71 as described above by reason of the fact that the magnetic fluxes generated by the permanent magnet 71 are varied due to the variations of the shape of the material and the magnetization process, and since the magnetic field of this portion is a combination of the magnetic fields generated by the first magnetic lens (projection lens) 30 and the second magnetic lens 35, the desired magnetic field cannot be formed if the magnetic field generated by the second magnetic lens is varied. In view of this, according to this embodiment, the desired magnetic field is obtained by adjusting the current flowing in the auxiliary coil 73 arranged around the permanent magnet 71. The auxiliary coil 73 and the yoke 74 are for adjusting the variations of the permanent magnet 71, and may not be large in size as long as it can generate magnetic fluxes slightly larger than the range of variations of the permanent magnet 71. Therefore, the second magnetic lens 35 can be made more compact than when it is formed only of an electromagnetic lens without using a permanent magnet.

FIG. 5 is a diagram showing a distribution of magnetic flux density in the neighborhood of the specimen according to the present embodiment. In FIG. 5, reference numeral 91 designates the position of the specimen surface, numeral 92 the position of the upper surface of the pole piece 72, numeral 93 the distribution of the magnetic flux density of the magnetic field due to the first magnetic lens, numeral 94 the distribution of the magnetic fluxes of the magnetic field due to the second magnetic lens, and numeral 95 the distribution of the magnetic flux density of the magnetic field of the immersion lens constituting the magnetic fields of the first magnetic lens and the second magnetic lens combined. For example, the second magnetic lens generates a magnetic field of about 1000 Gausses on the upper surface of the pole piece 72 and about 800 Gausses at a position on the specimen surface. For the electron beam exposure apparatus, the magnetic field under the specimen surface (on the second magnetic lens side) is not related to the image-forming performance of the electron beam and may assume any state.

The auxiliary coil 73 and the yoke 74 formed around the permanent magnet 71 to adjust the variations thereof in the embodiment described above may be done without in the case where the variations of the magnetic fluxes of the permanent magnet 71 are sufficiently small.

Further, to the extent that the variations of the permanent magnet 71 are small, the desired magnetic field can be formed by adjusting the vertical position of the permanent magnet 71.

As described above, a performance equivalent to that of the prior art can be obtained even when the second magnetic lens is reduced in size. As a result, for such an apparatus as the electron beam projection system which includes a stage formed above the second magnetic lens, the freedom of designing the stage is increased. This makes it possible to reduce in size and improve the accuracy of the electron beam projection system as a whole.

Also, current need not be supplied for using the permanent magnet and no heat is generated. Since no heat distribution is generated in the peripheral portions thereof, the projection accuracy is improved.

What is claimed is:

1. An immersion lens comprising:
a first magnetic lens having a bore for passing the incident electron beam and generating a first magnetic field; and
a second magnetic lens for generating a second magnetic field for converging said electron beam;
wherein the combined magnetic field of said first and second magnetic fields converges said electron beam between said first magnetic lens and said second magnetic lens, characterized in that said second magnetic lens includes a permanent magnet; and
wherein said second magnetic lens includes an auxiliary coil and a yoke arranged around said permanent magnet.

2. An immersion lens according to claim 1, wherein said permanent magnet is arranged on the axis of said second magnetic lens.

3. An immersion lens according to claim 1, wherein said permanent magnet is a solid-cylindrical permanent magnet; and wherein said auxiliary coil and said yoke are configured for adjusting the magnetic field generated by said permanent magnet.

4. An electron beam projection system comprising an electron gun for generating an electron beam, and an immersion lens for converging said electron beam generated by said electron gun, a specimen being irradiated with said electron beam converged by said immersion lens;
wherein said immersion lens includes:
a first magnetic lens arranged adjacent an upper surface of said specimen which faces said electron gun, said first magnetic lens having a bore through which said electron beam is passed and generating a first magnetic field; and
a second magnetic lens being arranged on the opposite side of said specimen relative to the first magnetic lens, said second magnetic lens including a solid-cylindrical permanent magnet, and an auxiliary coil and a yoke arranged around said permanent magnet for adjusting the magnetic field generated by said permanent magnet and generating a second magnetic field,
wherein a combined magnetic field of said first and second magnetic fields converges said electron beam between said first magnetic lens and said second magnetic lens.

5. An immersion lens comprising:
a first magnetic lens having a bore for passing the incident electron beam and generating a first magnetic field; and
a second magnetic lens for generating a second magnetic field;
wherein the combined magnetic field of said first and second magnetic fields converges said electron beam between said first magnetic lens and said second magnetic lens; and
wherein said second magnetic lens comprises a solid-cylindrical permanent magnet, and an auxiliary coil and a yoke arranged around said permanent magnet for adjusting the magnetic field generated by said permanent magnet.

6. An immersion lens according to claim 5, wherein said permanent magnet is arranged on the axis of said second magnetic lens.

* * * * *